United States Patent
Lin

(10) Patent No.: US 12,477,849 B2
(45) Date of Patent: Nov. 18, 2025

(54) FAN-OUT PACKAGE STRUCTURE OF IMAGE SENSING DEVICE AND MANUFACTURING METHOD THEREOF

(71) Applicant: Powertech Technology Inc., Hukou (TW)

(72) Inventor: Ching-Chao Lin, Hukou (TW)

(73) Assignee: Powertech Technology Inc., Hsinchu (TW)

( * ) Notice: Subject to any disclaimer, the term of this patent is extended or adjusted under 35 U.S.C. 154(b) by 425 days.

(21) Appl. No.: 18/327,449

(22) Filed: Jun. 1, 2023

(65) Prior Publication Data

US 2023/0411419 A1 Dec. 21, 2023

(30) Foreign Application Priority Data

Jun. 21, 2022 (TW) ................................. 111123072

(51) Int. Cl.
*H10F 39/00* (2025.01)
(52) U.S. Cl.
CPC ......... *H10F 39/804* (2025.01); *H10F 39/026* (2025.01); *H10F 39/811* (2025.01)
(58) Field of Classification Search
CPC .... H10F 39/804; H10F 39/026; H10F 39/811; H10F 39/011
See application file for complete search history.

(56) References Cited

U.S. PATENT DOCUMENTS

| | | | | |
|---|---|---|---|---|
| 2014/0159212 A1* | 6/2014 | Hung | ................. | H01L 23/3135 257/666 |
| 2016/0322330 A1* | 11/2016 | Lin | ..................... | H01L 25/0652 |
| 2018/0026067 A1* | 1/2018 | Lee | .......................... | H10F 39/18 257/777 |
| 2018/0053745 A1* | 2/2018 | Cheng | ..................... | H01L 24/97 |
| 2018/0130750 A1* | 5/2018 | Jung | ....................... | H01L 24/20 |
| 2019/0189667 A1* | 6/2019 | Jung | ....................... | H01L 24/19 |
| 2020/0312783 A1* | 10/2020 | Min | ................... | H01L 23/49822 |
| 2021/0183813 A1* | 6/2021 | Yeh | ................... | H01L 23/49827 |
| 2022/0093693 A1* | 3/2022 | Kim | ................... | H10K 59/1213 |

FOREIGN PATENT DOCUMENTS

TW 201803056 A 1/2018

OTHER PUBLICATIONS

Search Report appended to an Office Action, which was issued to Taiwanese counterpart application No. 111123072 by the TIPO on Feb. 13, 2023, with an English translation thereof.

* cited by examiner

*Primary Examiner* — Mohsen Ahmadi
(74) *Attorney, Agent, or Firm* — Burris Law, PLLC

(57) ABSTRACT

A fan-out package structure of an image sensing device includes an image sensing unit having an image sensor with opposite sensing surface and connecting surface, a spacer layer surrounding a central portion of the sensing surface, and a light-transmitting cover plate disposed on the spacer layer spaced apart from and covering the sensing surface. An image signal processor is disposed on the connecting surface. A redistribution layer covers the image signal processor and the connecting surface, and includes a fan-out area. An encapsulation layer is disposed on the fan-out area, surrounds and covers an outer periphery of the image sensing unit, and allows a top surface of the light-transmitting cover plate to be exposed. A method of manufacturing a fan-out package structure of an image sensing device is also disclosed.

8 Claims, 5 Drawing Sheets

# FAN-OUT PACKAGE STRUCTURE OF IMAGE SENSING DEVICE AND MANUFACTURING METHOD THEREOF

CROSS-REFERENCE TO RELATED APPLICATION

This application claims priority to Taiwanese Invention Patent Application No. 111123072, filed on Jun. 21, 2022.

FIELD

The present disclosure relates to a package structure and a manufacturing method, and more particularly to a fan-out package structure of an image sensing device and a method of manufacturing the same.

BACKGROUND

In an existing chip package structure that combines CMOS image sensor (CIS) and image signal processor (ISP), generally, the image signal processor and the CMOS image sensor are disposed on two opposite sides of an interposer, after which they are connected to a printed circuit board (PCB).

An existing semiconductor package technology has developed towards the demand for small volume and high density package. However, the existing chip package structure has an overall package volume that is large due to the presence of the interposer and the printed circuit board.

SUMMARY

Therefore, an object of the present disclosure is to provide a fan-out package structure of an image sensing device that can alleviate at least one of the drawbacks of the prior art.

According to this disclosure, the fan-out package structure of an image sensing device includes an image sensing unit, an image signal processor, a redistribution layer, and an encapsulation layer. The image sensing unit includes an image sensor, a spacer layer, and a light-transmitting cover plate. The image sensor has a sensing surface, a connecting surface opposite to the sensing surface, a plurality of through-silicon vias extending through the sensing surface and the connecting surface, and a plurality of conductive elements respectively disposed in the through-silicon vias and exposed from the connecting surface. The spacer layer is disposed on the sensing surface and surrounds a central portion of the sensing surface. The light-transmitting cover plate is disposed on the spacer layer spaced apart from and covering the sensing surface. The image signal processor is disposed on the connecting surface.

The redistribution layer covers the image signal processor and the connecting surface of the image sensor, and includes a fan-out area extending outwardly from a bottom periphery of the image sensor, a metal circuit electrically connected to the image signal processor, and a plurality of conductive vias connected electrically and respectively to the conductive elements. The encapsulation layer is disposed on the fan-out area, surrounds and covers an outer periphery of the image sensing unit, and allows a top surface of the light-transmitting cover plate to be exposed.

Another object of the present disclosure is to provide a method of manufacturing a fan-out package structure of an image sensing device that can alleviate at least one of the drawbacks of the prior art.

According to this disclosure, the method of manufacturing a fan-out package structure of an image sensing device includes the steps of: preparing a plurality of the image sensing units; connecting top surfaces of the light-transmitting cover plates of the image sensing units to a temporary substrate such that the image sensing units are arranged spaced apart from each other on the temporary substrate and such that a gap is formed between each two adjacent ones of the image sensing units; disposing an encapsulation layer on the temporary substrate to cover the image sensing units, the encapsulation layer having a horizontal surface covering the image sensing units, and a plurality of vertical portions extending downwardly from the horizontal surface and respectively received in the gaps between the adjacent ones of the image sensing units; thinning the horizontal surface of the encapsulation layer to expose the connecting surfaces of the image sensors of the image sensing units; respectively disposing a plurality of image signal processors on the connecting surfaces of the image sensors of the image sensing units; forming a redistribution layer that simultaneously covers the image signal processors and that is connected to the connecting surfaces of the image sensors and top ends of the vertical portions of the encapsulation layer, the redistribution layer having a metal circuit electrically connected to the image signal processors, and a plurality of conductive vias connected electrically and respectively to the conductive elements of the image sensors of the image sensing units; forming a plurality of electrical connection units on the redistribution layer at positions corresponding to the image sensing units, the electrical connection units being electrically connected to the metal circuit and the conductive vias; and, removing the temporary substrate and cutting the redistribution layer and the encapsulation layer at positions corresponding to the gaps to thereby obtain a plurality of the image sensing devices.

BRIEF DESCRIPTION OF THE DRAWINGS

Other features and advantages of the present disclosure will become apparent in the following detailed description of the embodiment with reference to the accompanying drawings. It is noted that various features may not be drawn to scale.

DETAILED DESCRIPTION

Figure 1:
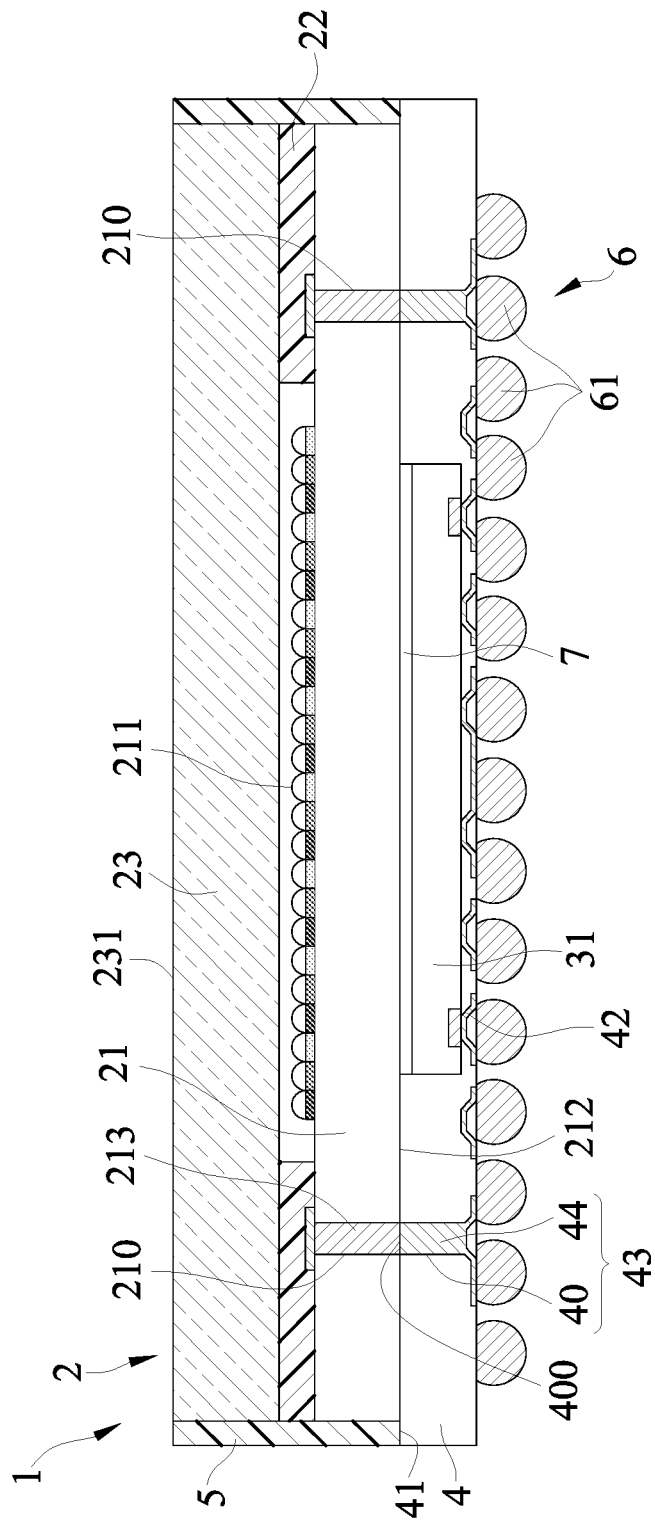
FIG. 1 is a schematic sectional view of a fan-out package structure of an image sensing device according to an embodiment of the present disclosure.

Referring to FIG. 1, a fan-out package structure of an image sensing device 1 according to an embodiment of the present disclosure includes an image sensing unit 2, an image signal processor (ISP) 31, a redistribution layer 4, an encapsulation layer 5, and an electrical connection unit 6.

The image sensing unit 2 includes an image sensor 21, a spacer layer 22, and a light-transmitting cover plate 23. Specifically, the image sensor 21 has a sensing surface 211, a connecting surface 212 opposite to the sensing surface 211, a plurality of through-silicon vias (TSVs) 210 extending through the sensing surface 211 and the connecting surface 212, and a plurality of conductive elements 213 respectively disposed in the TSVs 210 and exposed from the connecting surface 212. The spacer layer 22 is disposed on the sensing surface 211, and surrounds a central portion of the sensing surface 211. The light-transmitting cover plate 23 is disposed on the spacer layer 22 spaced apart from and covering the sensing surface 211 to protect the image sensor 21. That is, the spacer layer 22 is disposed between the image sensor 21 and the light-transmitting cover plate 23 to separate the two. The image sensing unit 2 belongs to a semi-finished product of an image sensing package, and only the light-transmitting cover plate 23 protects the image sensor 21.

In this embodiment, the image sensor 21 is a complementary metal oxide semiconductor image sensor (CIS), and the formation of the TSVs 210 is used as a signal conduction of the image sensor 21, so that there is no need to use the wire bond process. The spacer layer 22 is made of a UV light curable resin (UV epoxy). The light-transmitting cover plate 23 is a glass cover as an example for illustration.

The image signal processor 31 is disposed on and is directly adhered to the connecting surface 212 of the image sensor 21 using a die attach film (DAF) 7 at a position corresponding to the central portion of the sensing surface 211.

The redistribution layer 4 covers the image signal processor 31, is connected to the connecting surface 212 of the image sensor 21, and includes a fan-out area 41 extending outwardly from a bottom periphery of the image sensor 21, a metal circuit 42 electrically connected to the image signal processor 31, and a plurality of conductive vias 43 connected electrically and respectively to the conductive elements 213. Each conductive via 43 is formed by first forming a through hole 40 in the redistribution layer 4, after which a conductive member 44 is disposed in the through hole 40 to thereby form the conductive via 43. It should be noted that the conductive member 44 may fully or partially fill the through hole 40, and is disposed only in an inner wall surface of the through hole but is not particularly limited thereto.

A method of electrically connecting the redistribution layer 4 and the image sensor 21 is by connecting electrically and respectively the conductive members 44 in the through holes 40 of the redistribution layer 4 with the conductive elements 213 in the TSVs 210, so that an interface 400 is formed between each conductive member 44 and the respective conductive element 213. In this embodiment, the material suitable for each of the conductive element 213 and the conductive member 44 is copper (Cu), and the seed layer used for providing electroplating connection between the conductive element 213 and the conductive member 44 to form the interface 400 may be titanium (Ti) or copper (Cu), but not limited thereto. It should be noted that, since the thickness of the redistribution layer 4 is relatively thin, it is easy to align the conductive members 44 in the conductive vias 43 and the conductive elements 213 in the TSVs 210 with each other, resulting in high yield. If the through holes 40 and the TSVs 210 are directly electroplated once, that is, a conductive material is directly formed between each through hole 40 and the respective TSV 210, the interface 400 of this disclosure will not be formed. At this time, when the one-time electroplating is directly performed on the two aligning holes (i.e., the through hole 40 and the TSV 210), it is easy to cause uneven plating due to the aspect ratio problem, thereby affecting the product yield.

The encapsulation layer 5 is disposed on the fan-out area 41, surrounds and covers an outer periphery of the image sensing unit 2, and allows a top surface 231 of the light-transmitting cover plate 23 to be exposed. With the encapsulation layer 5 completely covering the outer peripheries of the image sensor 21 and the light-transmitting cover plate 23, it can provide the image sensor 21 with good protection. The material suitable for the encapsulation layer 5 of this embodiment may be, for example, thermosetting epoxy resin. In this embodiment, a top surface of the fan-out area 41, the connecting surface 212 of the image sensor 21, and the interface 400 are coplanar, so that the encapsulation layer 5 can completely cover the outer periphery of the image sensor 21.

The electrical connection unit 6 includes a plurality of solder balls 61 disposed on the redistribution layer 4 at a side opposite to the fan-out area 41 and electrically connected to the metal circuit 42 and the conductive vias 43.

It should be particularly noted that, through the direct provision of the redistribution layer 4, the fan-out package structure of the image sensing device 1 of this disclosure does not need to be provided with an interposer and/or a printed circuit board like the existing chip package structure, so that the volume of the fan-out package structure of this disclosure can be effectively reduced. Furthermore, with the redistribution layer 4 having the fan-out area 41 that extends outwardly from the bottom periphery of the image sensor 21, the metal circuit 42 and the corresponding solder balls 61 can extend toward an outer periphery of the redistribution layer 4 and toward the fan-out area 41, and the size of the entire fan-out package structure of this disclosure can be freely defined.

To better understand the structural features of the aforementioned embodiment, the steps involved in the method of manufacturing the fan-out package structure of the image sensing device 1 of this disclosure will be described in detail below.

Figure 2:
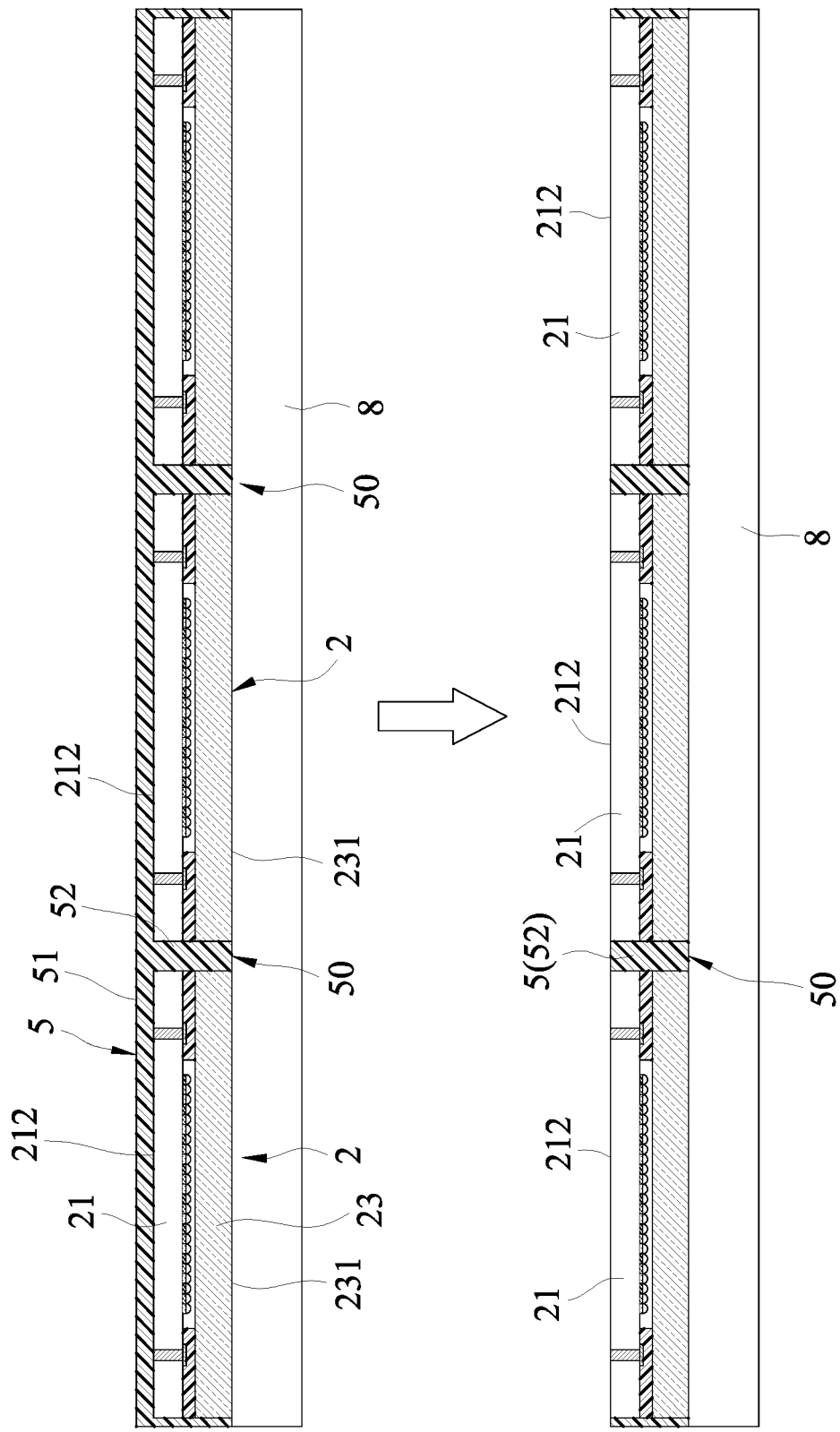
FIG. 2 is a schematic flow diagram illustrating a method of manufacturing the fan-out package structure of this disclosure, in which a plurality of image sensing units are connected to a temporary substrate, an encapsulation layer is disposed on the temporary substrate to cover the image sensing units, after which a horizontal surface of the encapsulation layer is thinned.

Referring to FIG. 2, a plurality of the image sensing units 2 are first prepared. Each image sensing unit 2 only has the light-transmitting cover plate 23 protecting the image sensor 21 at this time. Then, the image sensing units 2 are turned 180 degrees so that top surfaces 231 of the light-transmitting cover plates 23 of the image sensors 21 of the image sensing units 2 face downward, while the connecting surfaces 212 of the image sensors 21 face upward. Afterwards, the top surfaces 231 of the light-transmitting cover plates 23 are connected to a temporary substrate 8 such that the image sensing units 2 are arranged spaced apart from each other on the temporary substrate 8. Since the image sensing units 2 are arranged spaced apart from each other, a gap 50 is formed between each two adjacent ones of the image sensing units 2.

Next, the encapsulation layer 5 is disposed on the image sensing units 2, and has a horizontal surface 51 covering the connecting surfaces 212 of the image sensors 21, and a plurality of vertical portions 52 extending downwardly from the horizontal surface 51 and respectively received in the gaps between the adjacent ones of the image sensing units 2. Then, the horizontal surface 51 of the encapsulation layer 5 is thinned to expose the connecting surfaces 212 of the image sensors 21 of the image sensing units 2. The method of thinning the horizontal surface 51 of the encapsulation layer 5 may be accomplished using, for example, a physical grinding method, but not limited thereto.

Figure 3:
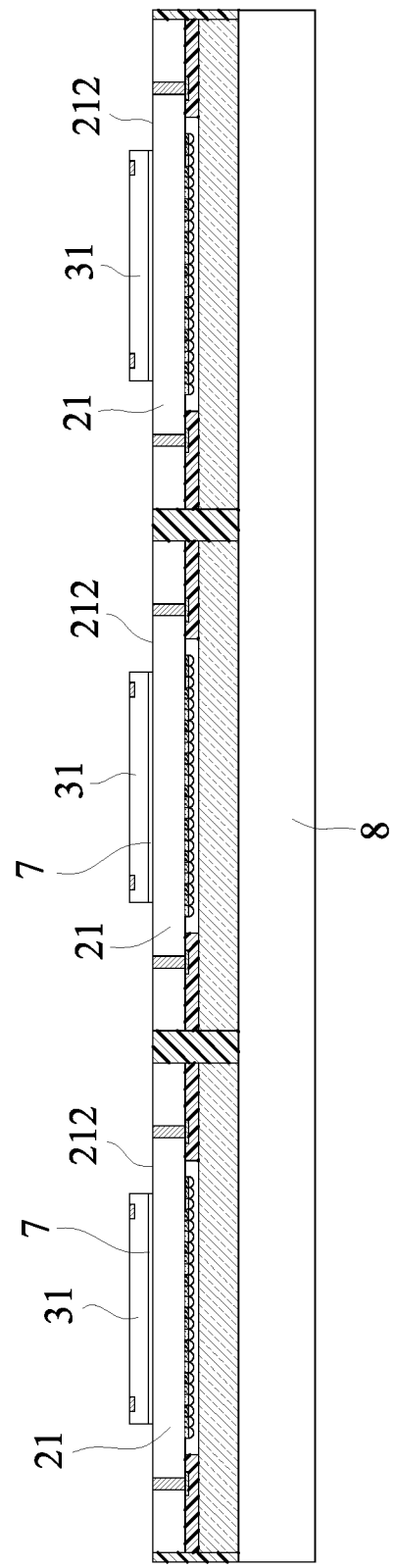
FIG. 3 is a schematic sectional view of the method of this disclosure, illustrating a plurality of image signal processors respectively disposed on connecting surfaces of a plurality of image sensors of the image sensing units.

Referring to FIG. 3, after the horizontal surface 51 of the encapsulation layer 5 is thinned, the image signal processors 31 are adhered directly and respectively to the connecting surfaces 212 of the image sensors 21 using the die attach films (DAF) 7.

Figure 4:
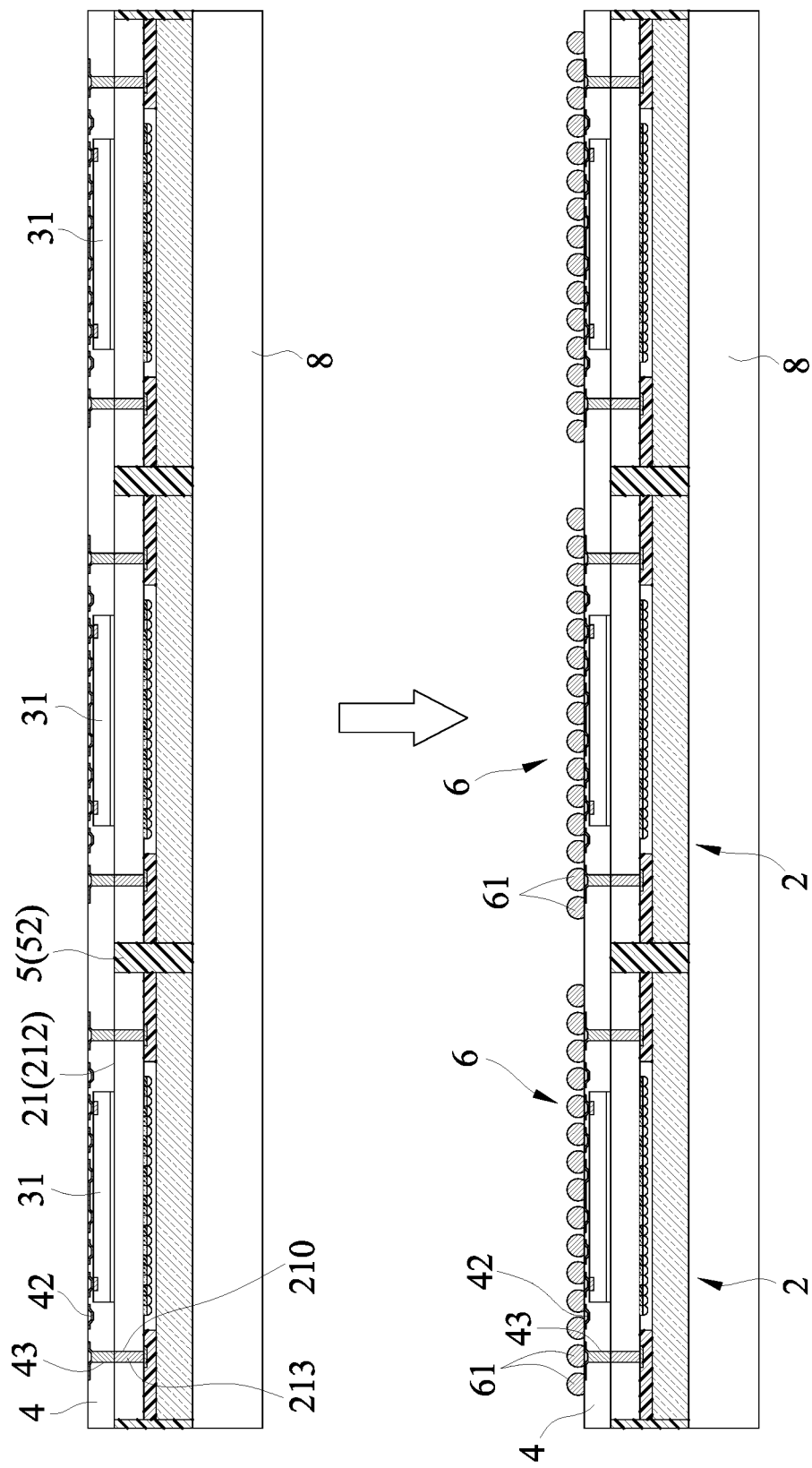
FIG. 4 is a schematic flow diagram of the method of this disclosure, illustrating the formation of a redistribution layer and an electrical connection unit.

Referring to FIG. 4, a redistribution layer (RDL) 4 is formed that simultaneously covers the image signal processors 31 and that is connected to the connecting surfaces 212 of the image sensors 21 and top ends of the vertical portions 52 of the encapsulation layer 5. The redistribution layer 4 has a metal circuit 42 electrically connected to the image signal processors 31, and a plurality of conductive vias 43 connected electrically and respectively to the conductive elements 213 in the TSVs 210 of the image sensors 21.

In this embodiment, a plurality of through holes 40 are formed in the redistribution layer 4 through a lithography process, such as exposure or developer, and each through hole 40 is disposed with a conductive member 44 (see FIG. 1) to thereby form the conductive via 43. With the through holes 40 being formed by the lithography process, overheating of the heat source caused by a conventional laser method can be avoided, so that the functions of the image sensors 21 and the image signal processors 31 will not be affected.

Then, a plurality of electrical connection units 6 are formed on the redistribution layer 4 at positions corresponding to the image sensing units 2, and are electrically connected to the metal circuit 42 and the conductive vias 43. In this embodiment, each electrical connection unit 6 is composed of a plurality of solder balls 61, but not limited thereto.

Figure 5:
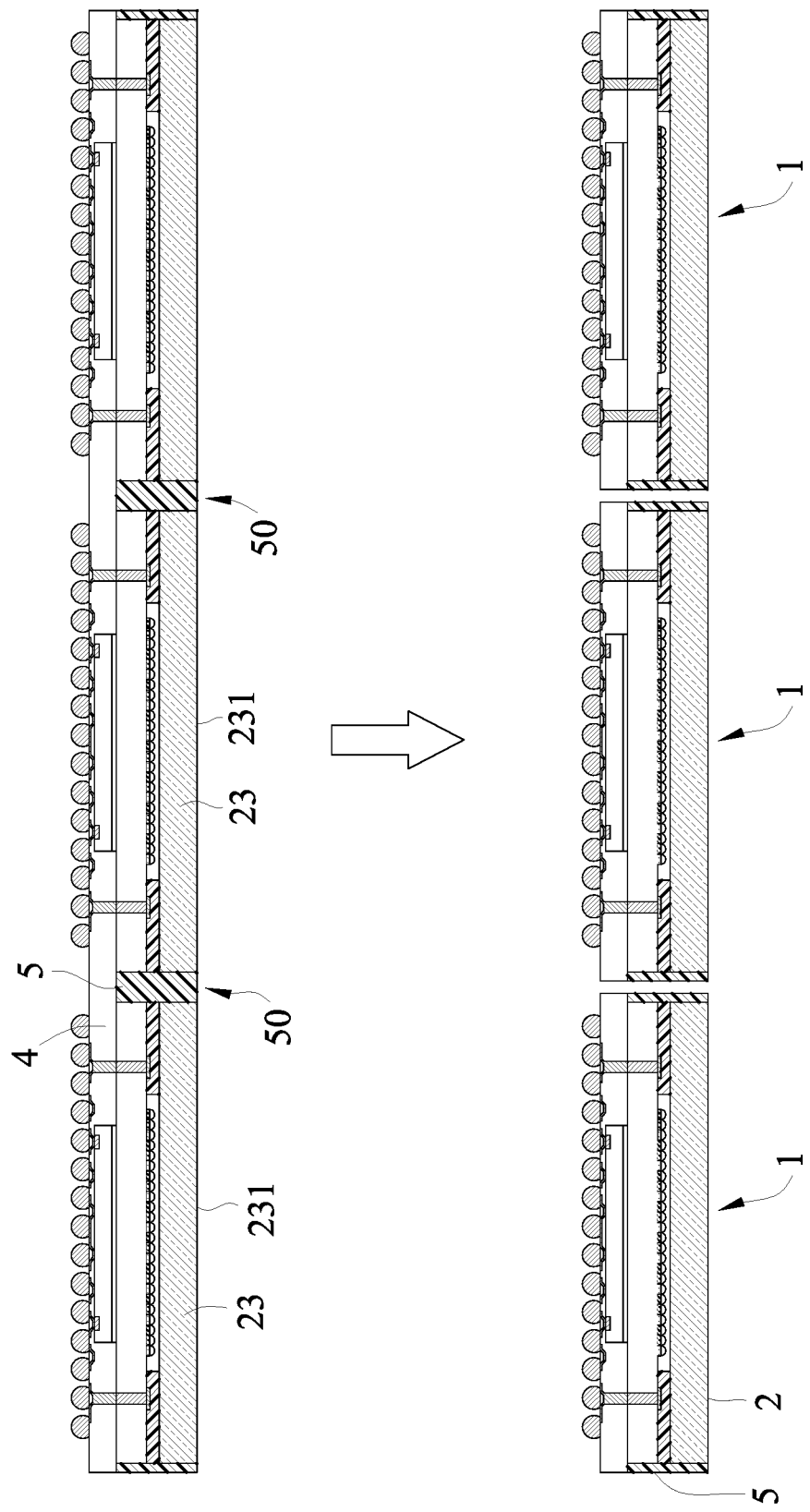
FIG. 5 is a schematic flow diagram of the method of this disclosure, illustrating the temporary substrate is removed, after which the redistribution layer and the encapsulation layer are cut to form a plurality of the image sensing devices.

Referring to FIG. 5, the temporary substrate 8 (see FIG. 4) is removed to expose the top surfaces 231 of the light-transmitting cover plates 23, after which the redistribution layer 4 and the encapsulation layer 5 are cut at positions corresponding to the gaps 50, thereby obtaining a plurality of the image sensing devices 1. After the redistribution layer 4 and the encapsulation layer 5 are cut, the encapsulation layer 5 is maintained to surround the outer periphery of the image sensing unit 2.

In summary, with the light-transmitting cover plate 23 and the image sensor 21 having the TSVs 210 cooperating with each other to constitute the image sensing unit 2, with the image signal processor 31 being disposed on the connecting surface 212 of the image sensor 21, and with the redistribution layer 4 that covers the image signal processor 31 and the connecting surface 212 of the image sensor 21 and that forms the fan-out area 41 extending outwardly from the bottom periphery of the image sensor 21, the image signal processor 31 is provided with a good protection, and the image sensor 21 having the TSVs 210 can provide a short signal transmission path to thereby accelerate the signal processing of the image sensor 21 by the image signal processor 31. Moreover, the electrical connection unit 6 can further cooperate with the fan-out area 41 and the encapsulation layer 5 to define the size of the subsequent packaging area. Therefore, the object of the present disclosure can indeed be achieved.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A fan-out package structure of an image sensing device comprising:
    an image sensing unit including an image sensor, a spacer layer, and a light-transmitting cover plate, said image sensor having a sensing surface, a connecting surface opposite to said sensing surface, a plurality of through-silicon vias extending through said sensing surface and said connecting surface, and a plurality of conductive elements respectively disposed in said through-silicon vias and exposed from said connecting surface, said spacer layer being disposed on said sensing surface and surrounding a central portion of said sensing surface, said light-transmitting cover plate being disposed on said spacer layer spaced apart from and covering said sensing surface;
    an image signal processor disposed on said connecting surface;
    a redistribution layer covering said image signal processor and said connecting surface of said image sensor, and including a fan-out area extending outwardly from a bottom periphery of said image sensor, a metal circuit electrically connected to said image signal processor, and a plurality of conductive vias connected electrically and respectively to said conductive elements; and
    an encapsulation layer that is disposed on said fan-out area, that surrounds and covers an outer periphery of said image sensing unit, and that allows a top surface of said light-transmitting cover plate to be exposed,
    an electrical connection unit disposed on said redistribution layer at a side opposite to said fan-out area and electrically connected to said metal circuit and said conductive vias.

2. The fan-out package structure as claimed in claim 1, wherein said metal circuit extends toward an outer periphery of said redistribution layer and toward said fan-out area, and said electrical connection unit includes a plurality of solder balls electrically connected to said metal circuit and said conductive vias.

3. The fan-out package structure as claimed in claim 1, wherein said redistribution layer is formed with a plurality of through holes through a lithography process, and a plurality of conductive members are respectively disposed in said through holes to thereby form said conductive vias.

4. The fan-out package structure as claimed in claim 3, wherein an interface is formed between each of said conductive members and a respective one of said conductive elements.

5. The fan-out package structure as claimed in claim 4, wherein a top surface of said fan-out area, said connecting surface of said image sensor, and said interface are coplanar.

6. The fan-out package structure as claimed in claim 1, further comprising a die attach film disposed between said image sensing unit and said image signal processor.

7. A method of manufacturing a fan-out package structure of an image sensing device comprising:
    preparing a plurality of the image sensing units as claimed in claim 1;
    connecting top surfaces of the light-transmitting cover plates of the image sensing units to a temporary substrate such that the image sensing units are arranged spaced apart from each other on the temporary substrate and such that a gap is formed between each two adjacent ones of the image sensing units;
    disposing an encapsulation layer on the temporary substrate to cover the image sensing units, the encapsulation layer having a horizontal surface covering the image sensing units, and a plurality of vertical portions extending downwardly from the horizontal surface and respectively received in the gaps between the adjacent ones of the image sensing units;

thinning the horizontal surface of the encapsulation layer to expose the connecting surfaces of the image sensors of the image sensing units;

respectively disposing a plurality of image signal processors on the connecting surfaces of the image sensors of the image sensing units;

forming a redistribution layer that simultaneously covers the image signal processors and that is connected to the connecting surfaces of the image sensors and top ends of the vertical portions of the encapsulation layer, the redistribution layer having a metal circuit electrically connected to the image signal processors, and a plurality of conductive vias connected electrically and respectively to the conductive elements of the image sensors of the image sensing units;

forming a plurality of electrical connection units on the redistribution layer at positions corresponding to the image sensing units, the electrical connection units being electrically connected to the metal circuit and the conductive vias; and removing the temporary substrate and cutting the redistribution layer and the encapsulation layer at positions corresponding to the gaps to thereby obtain a plurality of the image sensing devices.

8. The method as claimed in claim 7, wherein a plurality of through holes are formed in the redistribution layer through a lithography process, after which a plurality of conductive members are respectively disposed in the through holes to thereby form the conductive vias.

* * * * *